ANALOG TO DIGITAL CONVERTER APPARATUS
Filed May 21, 1957 5 Sheets-Sheet 1
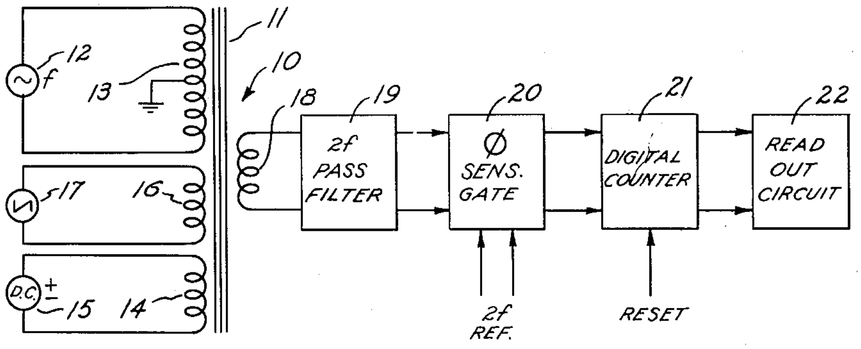
FIG. 1
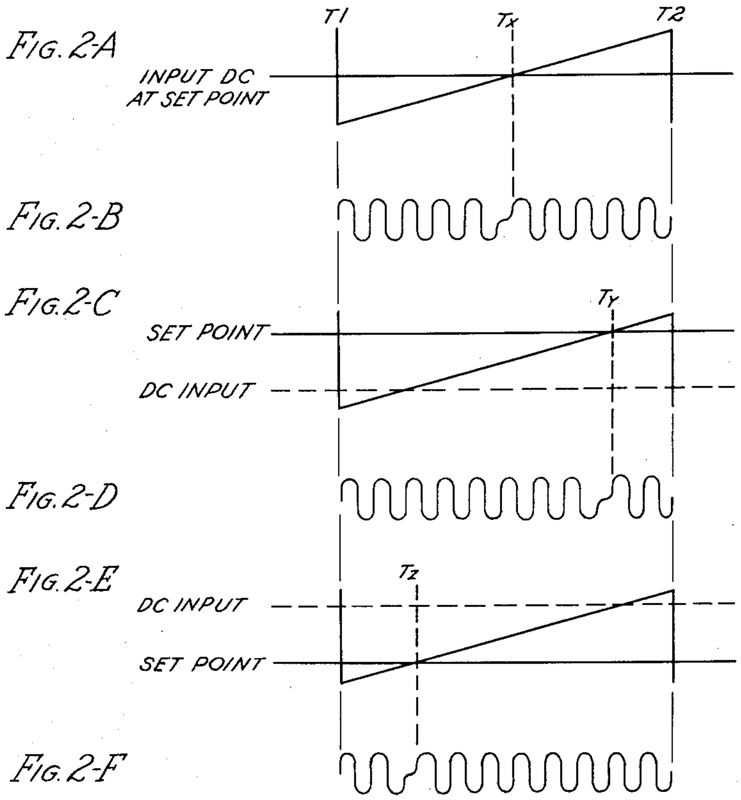
FIG. 2-A, FIG. 2-B, FIG. 2-C, FIG. 2-D, FIG. 2-E, FIG. 2-F
INVENTOR.
Henry L. Hanson INVENTOR.
Henry L. Hanson March 14, 1961 H. L. HANSON 2,975,411

ANALOG TO DIGITAL CONVERTER APPARATUS

Filed May 21, 1957 5 Sheets-Sheet 3

INVENTOR
Henry L. Hanson

March 14, 1961 H. L. HANSON 2,975,411

ANALOG TO DIGITAL CONVERTER APPARATUS

Filed May 21, 1957 5 Sheets-Sheet 4

INVENTOR
Henry L. Hanson

March 14, 1961 H. L. HANSON 2,975,411

ANALOG TO DIGITAL CONVERTER APPARATUS

Filed May 21, 1957 5 Sheets-Sheet 5

INVENTOR.

Henry L. Hanson

United States Patent Office 2,975,411

Patented Mar. 14, 1961

2,975,411

ANALOG TO DIGITAL CONVERTER APPARATUS

Henry L. Hanson, Needham, Mass., assignor, by mesne assignments, to Minneapolis-Honeywell Regulator Company, a corporation of Delaware

Filed May 21, 1957, Ser. No. 660,621

15 Claims. (Cl. 340—347)

A general object of the present invention is to provide a new and improved electrical apparatus useful in the conversion of electrical signals from one form into another. More specifically, the present invention is concerned with a new and improved apparatus for converting an analog signal into a digital signal, and the application of the digital circuitry to utilization circuitry which may be either digital or analog in operation.

Analog to digital converters have been receiving wide application in the field of data reduction and data analysis particularly where the signals most readily available from a primary source have taken an analog form. A typical example of an analog device is a thermocouple whose output potential on the leads thereof varies as a function of temperature. The analog voltages from such primary sensing elements as thermocouples have heretofore been amplified or otherwise manipulated in order to produce a signal of sufficient magnitude that it could be converted into a digital form. The amplification has involved linear direct current amplifiers which are difficult to achieve on a production line basis, or has involved self-balancing potentiometric circuits which are relatively slow, complex and expensive.

It is one of the objects of the present invention to achieve a converter capable of accepting analog signals directly from a primary sensing element and convert those signals directly into a digital form which may then be handled in any desired manner. Further, it is desired to accomplish the conversion at electronic speeds. It has been found that there are certain types of solid state electrical devices which exhibit electrical characteristics peculiarly adapted to this form of conversion. The ability to convert at the low signal levels of the analog primary sensing devices considerably simplifies the conversion problem and consequently considerably reduces the expense inherent in other known types of converters.

It is accordingly a further more specific object of the present invention to provide a new and improved analog to digital converter using a solid state device which is capable of operating at the signal levels of a primary analog sensing element.

A solid state device which may be used in one form of the present invention is a saturable core mechanism sometimes referred to as a magnetor. The magnetor is basically a non-linear element which has a symmetrical linear region about the origin of its hysteresis characteristic. The magnetor as used herein has applied thereto an analog signal, an alternating current excitation signal, and a suitable forcing function signal which is adapted to force the magnetor to operate over a predetermined range of its normal operating characteristic.

A form of magnetor which is adapted for use in the present invention is described in an article entitled "Magnetic Converter D-C Amplifier" by William A. Rote, December 1953 issue of Electronics, pages 170–173. The converter described in the Rote article is sometimes referred to as a second harmonic converter for the reason that when the magnetor is subjected to an unbalanced direct current on its input windings, there will appear in the output winding a second harmonic signal whose phase is characteristic of the direction of the D.-C. unbalance in the magnetor input windings.

It is accordingly a more specific object of the present invention to provide a new and improved analog to digital converter including a magnetor as the means for converting an analog signal into a digital signal.

The application of the forcing function to a device such as the magnetor has the effect of causing the A.C. phase of the signal in the output to be switched from one phase to a phase 180° displaced, whenever the device is shifted or forced through its zero flux state. Thus, by the cyclic application of a forcing function, which may take the form of a saw-tooth wave, it is possible to count the number of waves of a preselected phase. The count resulting will be a digital count which will be proportional to the analog value applied to the direct current input windings of the converter.

Another object of the invention is therefore to provide an analog to digital converter wherein a cyclically repetitive forcing function is applied to the converter and means are connected to the output of the converter to count the waves a selected phase of the signal on the output windings thereof.

The principles of the present invention are applicable to other types of solid state converters such as the Hall plate converter. In these other types of converters, a cyclically varying forcing function is applied to the converter so as to produce the desired variation in the output which again is phase responsive and directly related to the input analog signal.

A still further more specific object of the invention is therefore to provide an analog to digital converter using a Hall plate mechanism as the converting means.

The various features of novelty which characterize the invention are pointed out with particularity in the claims annexed to and forming a part of the present specification. For a better understanding of the invention, its advantages, and specific objects attained with its use, reference should be had to the accompanying drawings and descriptive matter in which there are illustrated and described preferred embodiments of the invention.

Of the drawings:

Figure 1 is a diagrammatic representation of the elements utilized in the present invention;

Figures 2A–F shows graphically the operating characteristics of the present invention;

Figure 3:
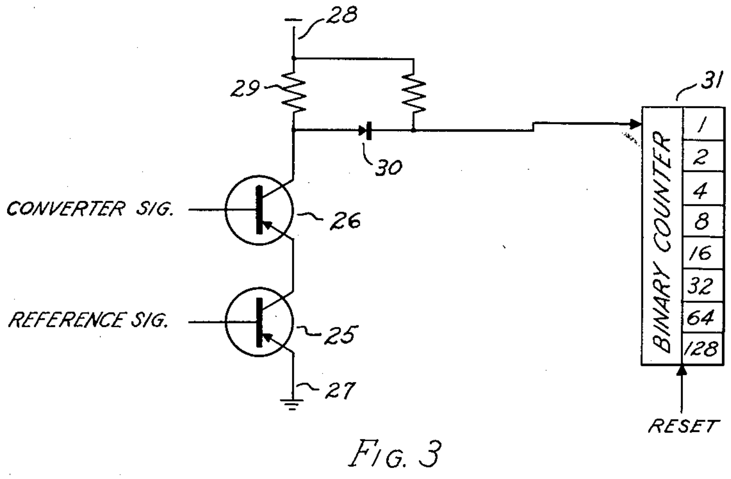
Figure 3 shows a signal gating circuit which may be used in conjunction with the apparatus of Figure 1.

Referring first to Figure 1, the numeral 10 represents the basic conversion element used with the present apparatus. This element 10 comprises a magnetor which may be of the type described in the above mentioned article by William A. Rote. This magnetor comprises a magnetic core means 11 which generally takes the form of a pair of disc type core members formed of a paramagnetic material. For exciting the cores of the magnetor there is provided an alternating current source 12 which is connected to an excitation winding means 13. In addition, the magnetor 10 has a direct current input winding 14, the latter of which may be suitably connected to an analog signal source which produces an output direct current proportioned to the magnitude of some variable which is to be measured. This source is shown generally as a D.C. source 15.

A further winding on the magnetor 10 is the winding 16. This winding will be designated here as a forcing function winding to which a suitable forcing function signal source 17 is connected. In the description used herein, the forcing function is a saw-tooth signal which is varying at a rate less than the excitation source 12. In one embodiment of the invention using a Doelcam magnetic converter type 2H–2, the source 12 had a frequency of 1300 c.p.s. and source 17 had a frequency of 60 c.p.s.

An output winding 18 which will have a second harmonic signal when the magnetor 10 is unbalanced is connected through a second harmonic filter 19 to a phase sensitive gating circuit 20. The gating circuit has as an additional input a second harmonic reference signal, the latter always being of a fixed phase.

Connected to the output of the phase sensitive gate 20 is a suitable digital counter, the latter being adapted to count the electrical pulses present on the output of the gate 20. A counter suitable for use in the present configuration is the counter illustrated and described in the copending application of Way Dong Woo entitled "Control Apparatus," bearing Serial Number 601,448, and filed August 1, 1956. The digital counter has its output suitably connected to a readout circuit of any suitable type well known in the art. This may be a typewriter, a paper tape punch, a magnetic tape, or the like.

In considering the operation of the apparatus of Figure 1, it should first be noted that when the excitation signal source 12 is energized and is applying the excitation signals to the excitation windings 13 of the magnetor 10, the core means 11 will be cyclically driven in its linear range of operation. As long as the magnetic fluxes on the core means 11 are not unbalanced by signals from the winding 14 or 16, the signals introduced into the core means 11 will not produce on the output in the output winding 18. However, when a direct current is applied to the core input winding 14, for example, the core means 11 will become unbalanced so that the excitation winding will now be driving the core into one or the other of its two saturated regions. When unbalanced, there is a signal in the output winding 18 and this signal is a second harmonic signal.

In order to determine the extent of the unbalance introduced by the direct current source 15, it is possible to force the magnetor 10 through a range of operation so that its output signal will vary in a manner directly related to the unbalance introduced by the source 15. This forcing is achieved by the saw-tooth signal source 17 as applied to the winding 16.

Figure 2A represents the operation when the saw-tooth signal from the source 17 is applied to the magnetor 10 when there is no unbalance direct current applied to the winding 14. The saw-tooth signal is shown in Figure 2A to start with a negative swing to a predetermined negative potential at time T1 and then linearly change in an increasing direction until time T2. The effect of this saw-tooth signal is to create on the winding 16 of the magnetor 10 a slowly changing direct current signal which forces the magnetor to be unbalanced first in a negative direction and then in a positive direction. Figure 2B represents the output signal which may be observed on the output of the second harmonic filter 19. From time T1 to time TX, when the direct current is unbalanced in a negative direction on the winding 16, the phase of unbalance in the output winding 18 may be designated as a positive phase. At time TX, the forcing function crosses the zero or balance point of the magnetor 10, and consequently, upon further changing in a positive direction, will unbalance the magnetor in the opposite direction to thereby produce a negative phased signal which is 180° out of phase with the signal from time T1 to time TX.

As long as the time from time T1 to TX, and time TX to time T2 is the same, the number of positive phase waves on the output of the winding 18 will be equal to the number of negative phase waves.

It will be readily apparent that by providing a suitable phase discriminating means or gating means, it is possible to pass those waves of a particular phase and eliminate the waves of opposite phase. Further, the waves passed may be used to generate signals which, when suitably counted, will provide the desired digital indication of the analog value acting on the input of the magnetor 10. These are the functions of the phase sensitive gate 20 and the digital counter 21.

The displacement of the direct current from its balanced state, as represented in Figure 2A, so that there is a direct current unbalance which is away from the set point or zero value of the magnetor, the saw-tooth wave will then be superimposed upon this displaced signal so that it is in effect scanning across a different direct current range. Thus, as illustrated in Figure 2C, the direct current input on the winding 14 is in a negative direction. With the direct current displaced in a negative direction as illustrated, the forcing action of the saw-tooth wave will now be such that the net direct current applied to the magnetor 10 will be negative from the time T1 until time TY. This will result in a positively phased signal which will occur from time T1 to time TY. At time TY, the phase will be shifted 180° and the reversed phase signal will be present from time TY to time T2. Thus, as illustrated in Figure 2D, the number of positively phased sine waves will be seen to be considerably greater than the number of negatively phased sine waves from time TY to time T2. Again, by applying this through the phase sensitive gate 20 and digital counter 21, it is possible to reduce this signal to a digital count representative of the direct current displacement or direct current signal on the winding 14.

Figure 2E represents the unbalanced state which is opposite to that illustrated in Figure 2C. Here, the direct current input is assumed to be in a direction positive from the zero or set point value of the magnetor. This has the effect of causing the forcing function signal to produce a positively phased signal only from time T1 to time TZ. From time TZ to time T2, the output will be a negatively phased signal in the manner illustrated in Figure 2F. The number of positively phased signals will again be indicative of the digital value of the analog signal applied to the input winding 14.

Figure 3 is representative of one form of gating circuit capable of producing the desired output signal when a predetermined phase input signal is present on the input of the gate. This circuit comprises a pair of transistor devices 25 and 26, each including the usual base, emitter, and collector electrodes. The emitter-collector electrode circuits of the transistors 25 and 26 are connected in series between a ground terminal 27 and a negative supply terminal 28. Included in this connection is a suitable load resistor 29. Coupling the signal from the load resistor 29 is a diode 30 which connects to a suitable binary counter 31. The signals present on the output side of the diode 30 leading into the binary counter are electrical pulses each distinctly representing one complete sine wave signal of the selected phase which has been arranged to pass through the gating transistors.

The alternating current signal from the magnetor 10 is arranged to be applied to the base electrode of the transistor 26. As pointed out above, this converter signal will be a second harmonic signal. Consequently, the reference signal applied to the base electrode of the transistor 25 is also a second harmonic signal whose phase, in this case, will always remain fixed. If the phase of the converter signal is the same as that of the reference signal, the base electrodes of each of the transistors 25 and 26 will be biased negative at the same time. This will cause both of the transistors to conduct and there will be a resultant signal passed through the diode 30 into the binary counter 31. If the phases of the converter signal and the reference signal are not the same, there will be no output signal from the gate and consequently no signal passed to the binary counter.

It will thus be readily apparent that this gating circuit is capable of accepting the signals, such as represented in Figures 2A–F, and producing a series of output signals which may be applied to the binary counter 31. These signals, after a single scan, will be directly proportional to the analog value applied to the input of the magnetor 10. It will be readily apparent that the counter must be reset after each scanning or count in order to condition the counter for the next conversion cycle. The resetting may be accomplished in any desired manner by a signal which is related to the ending of the scanning cycle of the forcing function signal applied to the magnetor.

Figure 4:
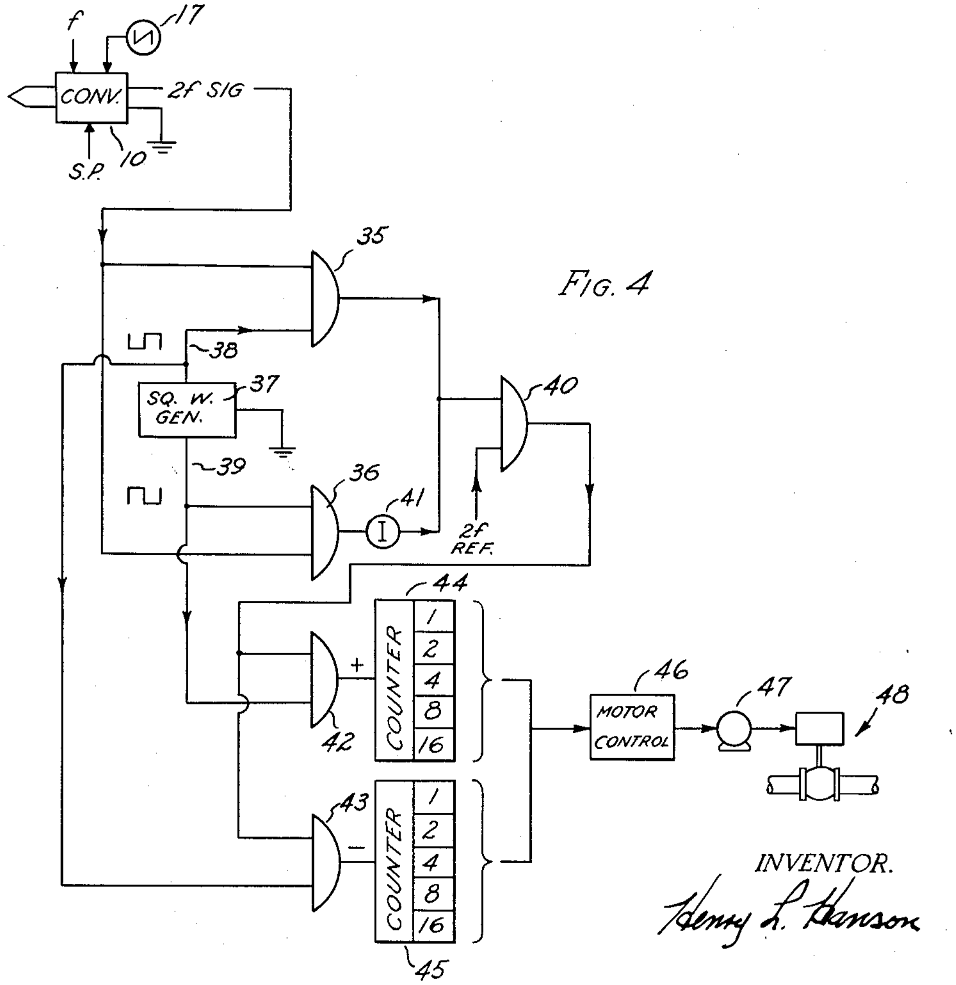
Figure 4 is a diagrammatic showing of how the present invention may be adapted for an analog control function.

The apparatus illustrated in Figure 4 illustrates one manner in which the digital signal from the converter 10 may be used to produce an analog control. Here, the converter 10 will produce a second harmonic signal in the manner described in conjunction with Figure 1, and this signal is then applied to a pair of signal gating circuits 35 and 36 which may be of the type illustrated in Figure 3. These two gating circuits 35 and 36 have an additional input signal derived from a square wave generator 37. The square wave generator 37 has two output lines 38 and 39 which are arranged to be of opposite phasing or polarity. The rate of operation of the square wave generator 37 is arranged to have the same operating cycle as the forcing function signal applied to the converter 10. The signal from the square wave generator 37 is also selected to be a symmetrical square wave so that the negative portion of the signal is of a time duration corresponding to the positive portion of the signal.

The output of the gate 35 is connected to a further gate 40. The output of the gate 36 is connected through an inverter 41 to the gate 40. Also connected to the gate 40 is a second harmonic reference signal.

Figure 5:
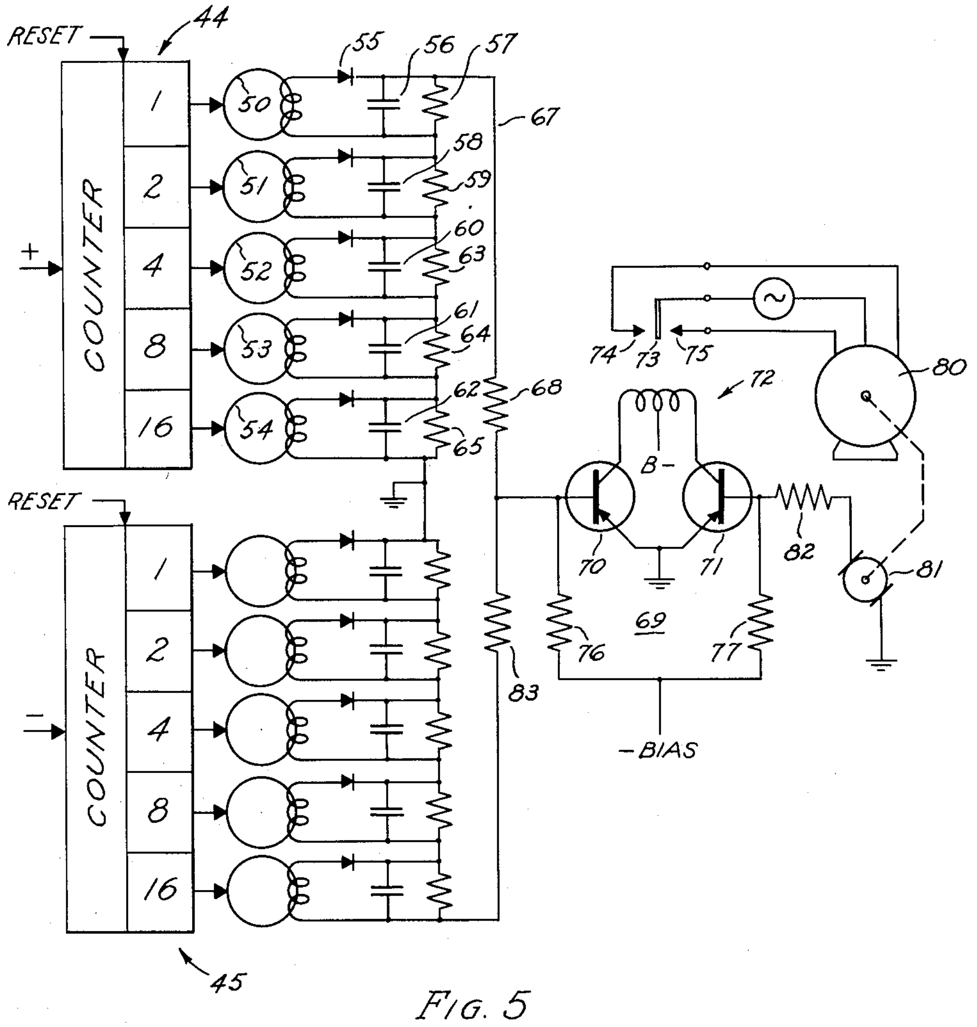
Figure 5 illustrates a form that the motor control circuit of Figure 4 may take.

The output of the gate 40 is applied to a further pair of gating circuits 42 and 43, which also may be of the type illustrated in Figure 3. These gating circuits also have inputs from the square wave generator 37. The output of the gating circuits 42 and 43 are applied to a pair of counter circuits 44 and 45 respectively. The output of the counters is then appropriately used, as illustrated in Figure 5, to control a motor control mechanism 46 which in turn supplies a control signal for a suitable motor means 47. The motor 47 may be a part of a suitable valve control device 48.

In considering the operation of Figure 4, it should first be noted that it is desired to take the second harmonic signal from the magnetic converter 10 and create from this signal an analog signal which may be used for controlling the motor 47. This is accomplished basically by scanning the output from the converter and producing a count which is indicative of the displacement of the direct current input from a zero or set point value. As it is necessary to determine if there is a plus unbalance or a minus unbalance on the input of the converter, it is necessary to provide the two counters 44 and 45.

As discussed in conjunction with Figure 2B, if the input direct current from source 15 is at the zero or set point value, the number of positively phased signals present on the output winding 18 will be the same as the number of negatively phased signals on the output during the second half of the scanning cycle.

Figure 6:
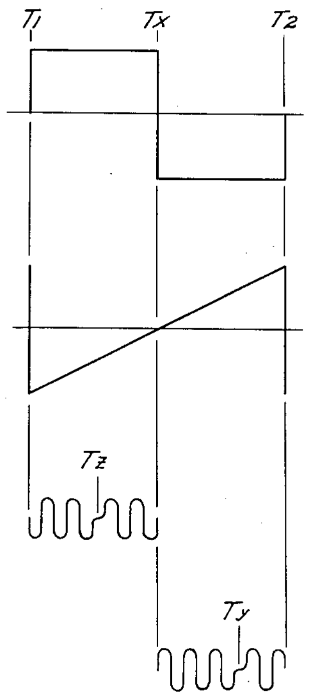
Figures 6A–D illustrate the operating characteristics of the circuit of Figure 4.

Considering the operation more specifically, the scanning operation in the converter 10 is divided into two separate half cycles, each of equal time length. Thus, the output from the square wave generator 37 as illustrated in Figure 6A, will function from time T1 to time T2 with a cross over or reverse in output polarity taking place at time TX. The waveform in Figure 6A may be assumed to be that upon the output lead 39 of the square wave generator 37. The phasing will be exactly 180° displaced on the output line 38.

During the first half cycle from time T1 to time TX, the output line 38 of the square wave generator will be negative and consequently both the gate 35 and the gate 43 will be conditioned to pass signals. On the other hand the gates 36 and 42 will be biased so that they can not pass signals. With gate 35 conditioned to pass signals, any signal from the converter 10, which is on the output will pass through the gate 35 to the gate 40 where it is gated against the reference second harmonic signal in a manner described in conjunction with Figure 1. To the extent that the phases of the signals are the same, there will be a series of output pulses from the gate 40 which will be applied to each of the gates 42 and 43. Since the gate 43 is the only gate open during the first half cycle, the signals will only pass through this gate 43 to the counter 45.

When the input direct current is exactly on the set point it is desired that the alternating current signal on the output of the converter and the reference signal on the input of the gate 40 be out of phase so that no signal is passed to the gate 43.

During the second half cycle, from time TX to time T2, the output line 39 of the square wave generator 37 will be negative and this will condition the gates 36 and 42 to pass signals. Further, the gates 35 and 43 will now be closed. As the output of the converter 10 will reverse in phase during the second half cycle as illustrated in Figure 2B, it is necessary that this signal again be inverted 180° by the inverter 41 before it is applied to the gate 40. The reason for this will be apparent when it is again recognized that no output signal is desired if there is no unbalance upon the input to the converter 10. Inasmuch as the reference signal is of constant phase, the only way to keep the gate from opening, is to insure that if no signal is wanted, the phase from the inverter will be 180° displaced from the reference signal. Thus, there will be no input to the counter 44 through the gate 42.

In the event that there is a direct current unbalance on the input of the converter 10, as illustrated in Figures 2E and 2F, it is desired that the counter devices 44 and 45 be appropriately activated to recognize that there is an unbalance and produce a signal indicative of the amount of that unbalance.

As viewed in Figure 6C, assuming that there is a cross over of the set point of the forcing function at time TZ, the phase of the signal will reverse at time TZ. Thus, the signal will be passed through the gate 35 during the first half cycle into the gate 40. The gate 40 will produce an output signal from time TZ to time TX. This signal will be applied from the output of the gate 40 into the counter 45 and the amount of the variable displacement from the set point will be counted by the counter 45. At the end of the first half cycle, the counter 45 will stop counting.

The other counter 44 will not have any input inasmuch as the phasing of the output from the converter 10 will not produce an output signal from the gate 40.

Each time that the variable is scanned by the forcing function signal, the counter 45 will produce a count which is proportional to the displacement of the variable from the zero value or set point value.

If the direct current input is displaced in a direction opposite to that assumed above, the counter 45 will not receive any input signals from the gate 40. However, the counter 44 will receive signals and the number of signals received will again be proportioned to the displacement of the direct current input from the zero or set point value. In this case, the gate 42 and the gate 36 will be opened during the second half cycle and upon the passing of the signals from the converter 10 as illustrated in Figure 6D, the counter will be effective to count those signals present from time TX to time TY. At the end of the cycle, the counter 44 will have stored a digital count representative of the displacement of the variable from its set point.

The apparatus for utilizing the digital count produced by the counters 44 and 45 is illustrated in Figure 5. It is assumed herein that both the counters 44 and 45 are binary counters and that the respective stages have the binary progression utilized therein so that with a five stage counter, the count in the various stages will be valued according to the binary progression of 1, 2, 4, 8, and 16. The counter stages of each of the counters are arranged to be read out through gating means, not shown, into magnetic core storage elements of the bistable type. Thus, stage 1 of the counter 44 if set is arranged to be read out into a core storage device 50. Stage 2 of the counter 44 is arranged to be read out into the core 51. Similarly, the stages 4, 8 and 16 are arranged to be read out into the cores 52, 53 and 54 respectively. Each of the cores are arranged to have an input winding and a shift winding, not shown, for writing into and shifting the information therein to the output winding. A discussion of this type of element will be found in an article by R. D. Kodis et al., entitled "Logical and Control Functions Performed with Magnetic Cores," Proceedings of the I.R.E., volume 43, Number 3, March 1955, pages 291–298.

Suitable shift windings are provided for each of the magnetic core elements 50–54 so that if a signal has been stored therein, the signal may be shifted to the output winding illustrated in the figure.

The output winding of the core 50 is connected through a diode 55 to an RC network formed by a condenser 56 and a resistor 57. If a 1 was stored in the first stage of the counter 44, the reading out would have set the core 50. The shifting of the core 50 will cause an output signal in the output winding to be fed through the diode 55 to charge the condenser 56. The condenser 56 will in turn discharge through the resistor 57 after a predetermined time delay. In a similar manner, if a signal is stored in stage 2 and has been read into the core 51, it may be read out and used to charge a condenser 58. The condenser 58 is in turn arranged to discharge through a resistor 59. Similar condensers 60, 61 and 62 are associated with the output windings on each of the core devices 52, 53 and 54 respectively. Similarly, load resistors 63, 64 and 65 are associated with the respective condensers 60, 61 and 62.

It will be noted that when any particular stage of the counter 44 has been set to represent a particular digit, the reading out of that stage will be effective to set the corresponding core. It will be apparent that the number of cores set will be proportional to the setting of the counter and thereby the displacement of the input signal from its zero or set point. When the cores 50–54 are shifted so that the signals therein are read into their associated RC networks, it will be apparent that there is produced between the ground terminal and the output lead 67 a signal proportional to the number of stages that have been set. This signal is coupled through a suitable summing resistor 68 to a differential amplifier circuit 69. This differential amplifier circuit comprises a pair of transistor devices 70 and 71 each having base, emitter, and collector electrodes. Connected in circuit with the transistors 70 and 71 is a differential relay 72 which controls the movement of a switch blade 73 with respect to contacts 74 and 75. A bias source is connected through a pair of resistors 76 and 77 to the base electrodes of the transistors 70 and 71, respectively.

The differential relay 72 is arranged to supply the directional control signals for a reversible electrical motor 80 which may be used, for example, to control a valve or other control means which is to be adjusted in an analog manner. The motor 80 is shown connected to a direct current generator 81, the latter producing an output signal directly proportional to the speed of operation of the motor 80 and of a polarity indicative of the direction of rotation of the motor 80. The signal from this generator is coupled through a summing resistor 82 to the base electrode of the transistor 71.

The counter 45 has the same basic output as the counter 44. In other words there are a series of magnetic core storage devices connected to the respective stages of the counter and these storage devices are, when shifted, arranged to read out their signals into associated RC networks which will produce an output direct current signal of a magnitude proportional to the setting of the counter. The signal from the counter 45 will be passed through a suitable summing resistor 83 to the base electrode of the transistor 70.

Considering further the operation of the apparatus of Figure 5, it is assumed that the counter 44 has a signal stored in the first stage. The signal is then read out into the core 50 and this core will be set. If none of the other stages 2, 4, 8, and 16 are set, the only core set in the series will be core 50. Subsequent application of a shift pulse to this core will cause the core to produce an output signal which will be read into the condenser 56. The condenser will then discharge through the resistor 57. The discharge through the resistor 57 produces a voltage which is assumed to be a positive voltage so that between the ground terminal and the output lead 67 there will be a positive voltage. This positive voltage will be applied through the summing resistor 68 to the base electrode of the transistor 70.

In the absence of a signal on the transistors 70 and 71, the transistors will be conducting the same amount and the differential relay blade 73 will be centered so that neither of the contacts 74 or 75 are engaging the blade 73. As soon as the positive signal is applied through the summing resistor 68 to the base 70, the transistor 70 will become less conducting and the resultant unbalance will be effective to cause the switch blade 73 to move into engagement with the contacts 75. The closing of the contact will in turn apply a driving signal to the motor 80. The motor 80 will rotate and drive the generator 81 to produce on the output thereof a signal which is positive on the upper terminal. The positive signal will be applied to the resistor 82 to the base electrode of the transistor 71 and there will be a balance of the current flowing through the relay and the blade 73 will move back to its neutral position.

If the movement of the motor 80 did not produce a control action which completely balanced out the signal causing the setting of the first stage of the counter 44, a further signal will be produced in the subsequent cycle which will again cause the motor to make another movement. As soon as the unbalance causing the setting of the counter 44 has been eliminated, there will no longer be an output and the apparatus will remain in the balance state as illustrated in the figure.

If the unbalance on the input is on the opposite direction, the counter 45 will have appropriate stages set to indicate the extent of the unbalance. In this case, however, the signal on the output applied to the summing resistor 83 will be a negative signal. This negative signal will produce a biasing signal on the transistor 70 which will cause this transistor to become more conducting. This will result in the blade 73 moving into engagement with the contact 74 so that now the motor 80 will be moved in the reverse direction. Again, the generator 81 will be driven in the reverse direction and produce a corresponding negative signal on the output terminal leading through the resistor 82 to the transistor 71. This will in turn tend to bring the differential amplifier circuit back into a balanced state so that the switch blade 73 will move to its neutral position.

It will be readily apparent that the foregoing description with respect to the stages 1 in each of the counters 44 and 45 may be extended to the other stages. However, in order to recognize that the setting of the respective counter stages is a function of the unbalance, it is necessary to compensate the RC networks associated with each of the stages so that the time length of the discharge of the associated condenser will be proportional to the count represented by the stage which has set or charged the associated condenser. Thus, the time constant of the resistors 56 and 57 is selected to be considerably less than the time constant associated with the stage 16 in the condenser 62 and resistor 65. The reason for this will be readily apparent when it is noted that when the counter 44 has the stage 16 set, there is an indication of a relatively large unbalance in the input analog signal. Since there is a relatively large unbalance, it is necessary that a greater control action be exerted on the variable under control. Thus, the motor 80 should be driven for a longer period of time. This may be looked upon as a series of movements of the motor 80, if it is assumed that the generator 81 is capable of producing a signal to balance the signal on the input. If the signal causing the error and the consequent count, has not been eliminated, the circuit will once again become unbalanced and the motor will again make a further adjustment. This will continue until such time as the unbalance is eliminated.

It will accordingly be readily apparent that the time constants associated with the output circuits of each of the cores 50–54 must be suitably adjusted to recognize the distinction between the counts represented by the setting of the respective stages. It will be readily apparent that this thought may be carried one step further in providing that the resultant voltage across the respective condensers at the start of the discharging cycle is also a direct function of the particular stage which has been set. In a simple control system, this refinement is not essential but may be readily provided by suitably providing a voltage divider which will proportionally charge the condenser associated with each stage.

From the foregoing description, it will be readily apparent that there has been provided a new and improved analog to digital converter which is peculiarly adapted for producing a digital count directly from the input signal produced by a primary sensing element. Further, this digital signal is readily adapted for use in an analog control circuit by producing a count representative of the displacement of an analog value from its desired zero or set point. While the foregoing apparatus has been described particularly in conjunction with a magnetor as the converting element, it will be readily apparent that other forms of converter elements may be used in the same manner. Thus, for example, the Hall plate converter is adapted for use as an analog to digital converter.

Figure 7:
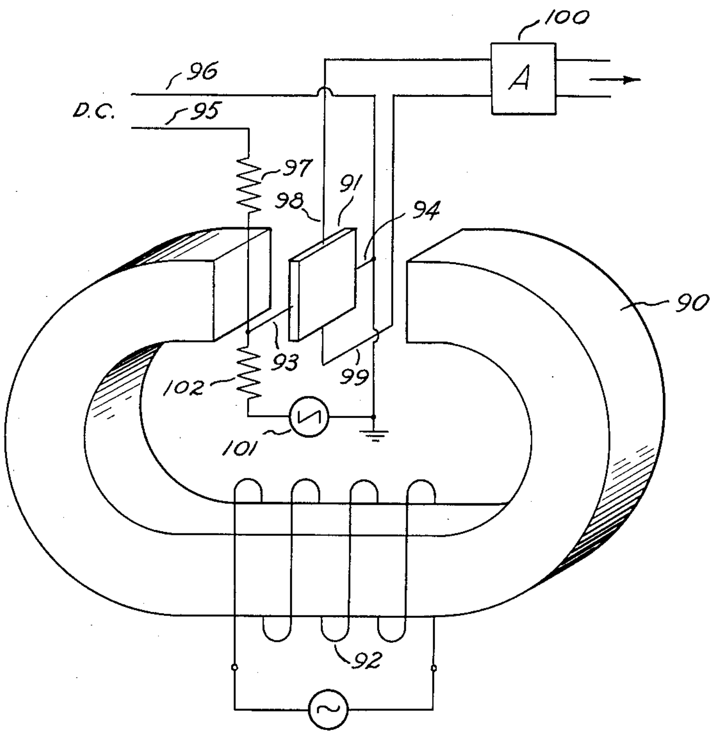

Figure 7 shows such a Hall plate converter and the manner in which it may be arranged in order to produce an output digital signal which is a direct function of the analog signal applied to the input. In Figure 7, the numeral 90 represents a magnetic core, said core having a gap therein into which is placed a suitable Hall plate 91 so that the plate is effectively positioned at right angles to the parallel lines of flux passing through the gap of the magnetic core 90. An excitation signal is applied to the core 90 by way of an input excitation winding 92, the latter being connected to a suitable source of alternating current. The Hall plate exhibits the characteristic that if an input direct current is applied thereto so as to unbalance the electrical fields therein, there will be produced on the output leads an alternating current signal whose phase is a direct function of the direction of the input direct current signal and whose frequency corresponds to the excitation frequency of the excitation winding.

The input direct current terminals for the Hall plate 91 illustrated here are terminals 93 and 94. The direct current source leads 95 and 96 lead to the input terminals 93 and 94 respectively. Included in the lead 95 is a summing resistor 97. The output terminals for the Hall plate are in the leads 98 and 99, the latter being connected to a suitable amplifier 100. Also connected to the input leads 93 and 94 is a forcing function signal source 101. Included in the connection to the lead 93 is a summing resistor 102.

In operation, the forcing function signal source 101 is selected to have a frequency which is a fraction of that of the excitation signal applied to the winding 92. The forcing function is again preferably a saw-tooth signal which has the effect of causing the Hall plate to see a direct current which is varying over or scanning the range of operation in the manner described in conjunction with the magnetor 10 of Figure 1. In this case, however, the output signal will not be a second harmonic signal. The alternating signal on the output is usable in the foregoing manner to produce a digital count with the reference signal in this case being the fundamental signal applied to the excitation winding 92. The amplifier 100 is used in connection with the Hall plate for the reason that the output signal is relatively small compared to the output from the magnetor. However, both devices may utilize amplifiers prior to the application of the alternating current signal to a phase sensitive gate.

As with Figure 1, the analog value on the input leads 95 and 96 is cyclically examined and an output digital count may be produced which is directly proportional to the analog value on the input.

While, in accordance with the provisions of the statutes, there has been illustrated and described the best forms of the invention known, it will be apparent to those skilled in the art that changes may be made in the forms of the apparatus disclosed without departing from the spirit of the invention as set forth in the appended claims, and that in some cases certain features of the invention may be used to advantage without a corresponding use of other features.

Having now described the invention, what is claimed as new and for which it is desired to secure by Letters Patent is:

1. A D.C. to A.C. converter having a D.C. input winding and an A.C. output winding, said output winding adapted to have a reversibly phased A.C. thereon in accordance with the magnitude and polarity of an input D.C. signal, and a variable signal circuit means positioned to act on said converter to force the converter to sweep across a range of input direct currents to thereby cause the A.C. signal output thereof to represent digitally the analog input.

2. An apparatus as defined in claim 1 wherein said converter comprises a Hall plate positioned in a magnetic field.

3. An apparatus as defined in claim 1 wherein said converter comprises a saturable core means adapted to produce on the output thereof a reversibly phased A.C. signal which is the second harmonic of an applied excitation signal.

4. An apparatus as defined in claim 1 wherein said circuit means comprises a ramp function generator having a saw-tooth signal output.

5. A magnetic analog to digital converter comprising a solid state device having a direct current signal input, an alternating signal excitation input, an alternating signal output, said output having a reversibly phased alternating signal output which is a direct function of the direct current signal input, a further variable signal input connected to said device and adapted to be cyclically operative at a frequency less than said alternating signal excitation input, and circuit means connected to said last named input to effectively force said solid state device through a simulated range of direct current signal inputs to thereby cause the alternating signal output to have an alternating output signal of one phase where the number of cycles of said one phase during each cyclic operation of said variable signal input is a digital representation of the direct current signal input.

6. A D.C. to A.C. converter having a reversibly phased alternating current output signal whose phase for a predetermined period of time is a direct function of a D.C. input signal, a digital signal gating circuit coupled to said converter and adapted to pass alternating signals of a single predetermined phase, and a digital counter connected to the output of said gating circuit.

7. A D.C. to A.C. converter having a D.C. input circuit, an A.C. excitation circuit, and an A.C. output circuit having a reversibly phased A.C. on the output terminals thereof, a signal gating circuit having a pair of inputs and an output, means connecting one of said inputs to said excitation circuit and the other of said inputs to said A.C. output circuit, and counter means connected to said gating circuit output.

8. An analog to digital converter comprising a D.C. to A.C. converter means having an excitation input, a direct current input and an output, and circuit means positioned to apply a saw-tooth forcing function to said converter so that said output will have a digital signal representation proportional to an analog input signal connected to said direct current input.

9. A D.C. to A.C. converter having a D.C. input winding and an A.C. output winding, said output winding adapted to have a reversibly phased A.C. thereon in accordance with the magnitude of the input D.C., and circuit means producing a steplessly variable signal connected to act on said converter to force the converter to sweep across a range of input direct currents to thereby cause the A.C. signal output thereof to represent digitally the analog input.

10. An apparatus as defined in claim 9 wherein said converter comprises a Hall plate positioned in a magnetic field.

11. An apparatus as defined in claim 9 wherein said converter comprises a saturable core means adapted to produce on the output thereof a reversibly phased A.C. signal which is the second harmonic of an applied excitation signal.

12. An apparatus as defined in claim 9 wherein said circuit means comprises a ramp function generator having a saw-tooth signal output.

13. A D.C. to A.C. converter having a D.C. input circuit, and A.C. excitation circuit, and an A.C. output circuit having a reversibly phased A.C. on the output terminals thereof, a phase sensitive signal gating circuit having a pair of inputs and a digital output, means connecting one of said inputs to said excitation circuit and the other of said inputs to said A.C. output circuit, and a digital counter means connected to said gating circuit output.

14. Apparatus for analyzing a variable comprising a variable sensing means having an analog output, an analog to digital converter connected to said sensing means, said converter comprising means adapted to produce a series of output digital signals of a first or second characteristic which, over a predetermined period of time, is a direct function of an analog input, a digital counter means connected to the output of said converter to produce a count which is a direct function of the extent and direction of deviation of the variable from a predetermined control point, said digital counter means comprising a pair of digital counters, one of which is adapted to produce a digital indication of a first variable direction of deviation represented by digital signals of said first characteristic and the other of which is adapted to produce a digital indication of a variable deviation in the opposite direction represented by digital signals of said second characteristic.

15. Apparatus as claimed in claim 14 wherein a forcing function signal source is connected to said converter to cyclically scan said variable, and said pair of counters are selectively gated for equal periods of time of each cycle of scanning.

References Cited in the file of this patent

UNITED STATES PATENTS

| | | |
|---|---|---|
| 2,685,054 | Brenner | July 27, 1954 |
| 2,695,384 | Stuart | Nov. 23, 1954 |
| 2,729,773 | Steele | Jan. 3, 1956 |
| 2,775,754 | Sink | Dec. 25, 1956 |
| 2,784,396 | Kaiser | Mar. 5, 1957 |
| 2,840,637 | McNaney et al. | June 24, 1958 |
| 2,857,586 | Wylen | Oct. 21, 1958 |
| 2,874,370 | Duinker | Feb. 17, 1959 |

OTHER REFERENCES

"The Hall Effect," T. R. Lawson, Jr., Westinghouse Engineer, May 1957, pp. 71–73.